United States Patent [19]

Studer

[11] Patent Number: 4,701,987

[45] Date of Patent: Oct. 27, 1987

[54] PROCESS FOR MANUFACTURING HIGH FREQUENCY QUARTZ RESONATORS

[75] Inventor: Bruno Studer, Rüttenen, Switzerland

[73] Assignee: ETA SA Fabriques d'Ebauches, Granges, Switzerland

[21] Appl. No.: 826,048

[22] Filed: Feb. 4, 1986

[30] Foreign Application Priority Data

Feb. 13, 1985 [FR] France ................... 85 02156

[51] Int. Cl.⁴ ................ H01L 41/08; H01L 41/10
[52] U.S. Cl. ................. 29/25.35; 430/316; 156/650; 156/651
[58] Field of Search ............ 29/25.35; 430/316; 156/650, 651

[56] References Cited

U.S. PATENT DOCUMENTS

| | | | |
|---|---|---|---|
| 3,432,205 | 1/1969 | Skaggs et al. | 430/316 X |
| 3,694,677 | 9/1972 | Guttwein et al. | 310/369 |
| 3,872,411 | 3/1975 | Wanatabe et al. | 29/25.35 X |
| 3,930,857 | 1/1976 | Bendz et al. | 430/316 X |
| 4,012,648 | 3/1977 | Engdahl | 29/25.35 X |
| 4,135,108 | 1/1979 | Besson | 310/369 X |

FOREIGN PATENT DOCUMENTS 2554289  5/1985  France ................ 29/25.35

Primary Examiner—Howard N. Goldberg
Assistant Examiner—Taylor J. Ross
Attorney, Agent, or Firm—Sughrue, Mion, Zinn, Macpeak & Seas

[57] ABSTRACT

The resonator obtained by this process comprises an active central portion, the thickness of which is reduced until the desired frequency is obtained. This may be of the order of 50 to 100 MHz. This central portion is surrounded by a considerably thicker reinforcing frame to which it is mechanically connected by means of one or more connecting members which are thinner than the active portion. The connecting member or members eliminate the need for coupling between the reinforcing frame and the active portion. Electrodes are provided for exciting the resonator.

12 Claims, 15 Drawing Figures

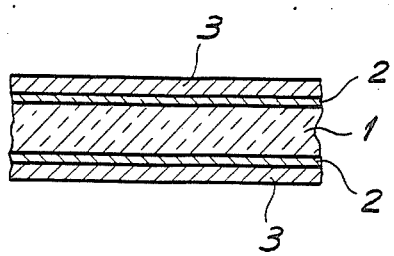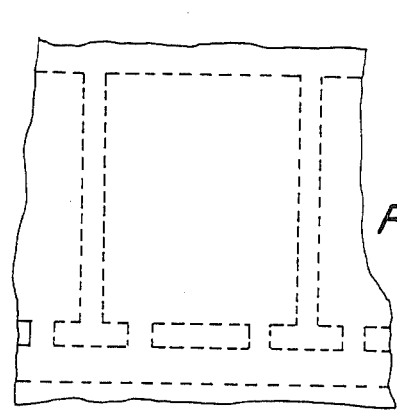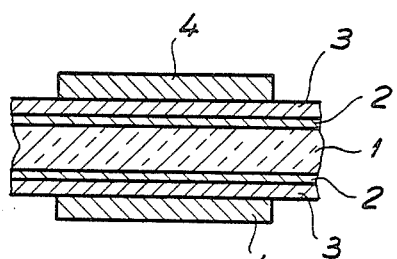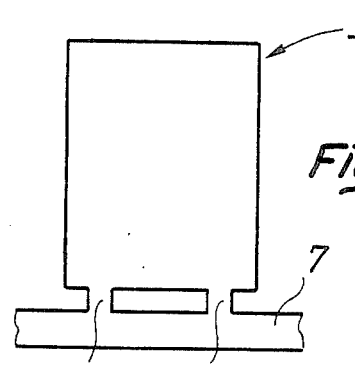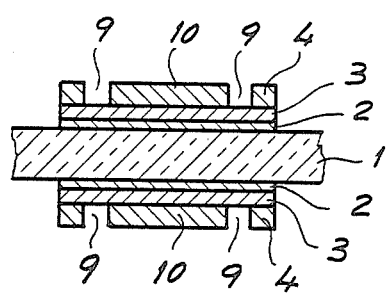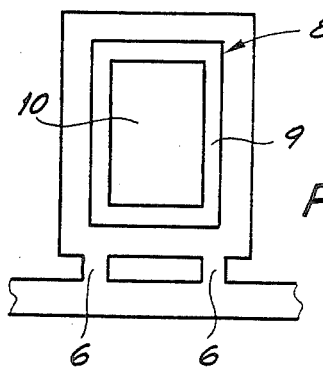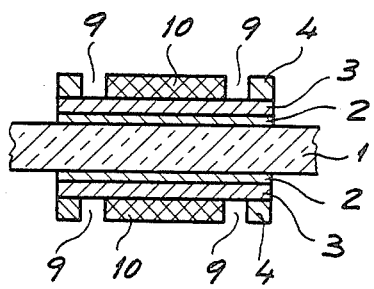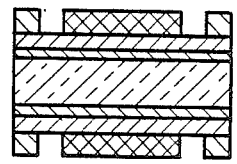

PROCESS FOR MANUFACTURING HIGH FREQUENCY QUARTZ RESONATORS

FIELD OF THE INVENTION

The present invention relates to a process for manufacturing quartz resonators operating within a relatively high frequency range, typically from 20 to 100 MHz. More particularly, the invention relates to quartz resonators operating in the thickness shear mode.

BACKGROUND OF THE INVENTION AND PRIOR ART

It is known that in this type of resonator the operating frequency depends directly on the thickness of the active crystal (U.S. Pat. No. 3,694,677). To achieve frequencies as high as those mentioned above, the thickness of the resonant element has to be extremely small (of the order of a few microns up to 100 microns), such that mechanical fabrication methods are wholly unsuitable.

Furthermore, handling of the elements is a very delicate operation and during use shocks can be fatal and cause the element to break.

This is why it is proposed in the abovementioned U.S. patent on the one hand to provide the resonator element with a reinforcing surround, which is considerably thicker than the resonator itself, and on the other hand preferably only to use non-mechanical fabrication methods such as chemical or ion etching at least in the last stage of the process leading to the desired thickness of the resonant element. Although these precautions can resolve to a certain extent the mechanical problems mentioned above, there nevertheless remain problems residing in the coupling which is between the resonator element and the reinforcing surround and which is too large. This leads to parasitic resonances and generally to a mediocre resonator characteric.

U.S. Pat. No. 4,135,108 describes a quartz resonator of the typein which the quartz is mounted as a dielectric between the electrodes of a capacitor, these electrodes being deposited on plates which hold the resonator in place. To this end, the resonator may comprise a peripheral ring wedged between the plates and separated from the resonator element proper by thinned-down portions which may take the form of simple connecting bridges extending radially between the peripheral ring and the resonator element.

The ring, the thinned-down bridges and the resonator element are of one piece and the shape of this whole unit is obtained by techniqes such as abrasion, chemical attack or the like. In certain cases this unit may be of uniform thickness throughout, with the exception of the connecting bridges, the main surfaces being parallel. Adjustment of the frequency of the resonant element may be obtained by the removal of material, but such a precise machining operation then involves all the main suface or surfaces of the unit comprising the ring, the bridges and the resonant central portion, in such a way that it entails a general mechanical weakening of this unit, including the outer ring. This latter can thus no longer act as a mechanical reinforcement and serves ultimately only as a fixing member. Although this arrangement leads to better decoupling with respect to the support, it is still fragile and withstands handling with difficulty. Furthermore, if the ring is relatively thin the reduction in the thickness of the central portion cannot be as great as could be desired, taking into account the high resonance frequencies to be obtained.

SUMMARY OF THE INVENTION

The invention aims to provide a process for manufacturing a quartz resonator and the resulting product, which process and product allow the combining of mechanical rigidity of the resonator with a frequency as high as 100 MHz.

The subject of the invention is therefore a process for manufacturing quartz resonators, especially AT-cut resonators operating in the thickness shear vibration mode, each resonator comprising an active central element surrounded by a reinforcing frame from which it is separated by at least one thinner connecting member. The process consists in subjecting a quartz substrate with parallel faces to selective operations of chemical etching and photolithography, and the process is characterized in that it consists in reducing the thickness of the substrate in the marginal area corresponding to the connecting member of each resonator whilst preserving those areas which correspond to the said central element and to the said reinforcing frame, and then in further reducing the thickness of the same marginal area at the same time as reducing the thickness of the central portion, this section reduction in thickness again not affecting the thickness of the said reinforcing frame.

The invention also provides a resonator obtained by the process as defined above.

This resonator, according to the invention, has the advantage of combining a high fundamental frequency with highly satisfactory mechanical resistance and vibration decoupling.

BRIEF DESCRIPTION OF THE DRAWINGS

Other characteristics and advantages of the invention will become more clearly apparent from reading the following description of various methods of implementing the invention, these being given as non-limiting examples.

Reference is made in the description to the drawings in which:

FIGS. 1A to 9B are respectively cross-sectional and plan views of a preferred method of implementing the manufacturing process according to the invention;

DESCRIPTION OF THE PREFERRED EMBODIMENTS

Figure 6:
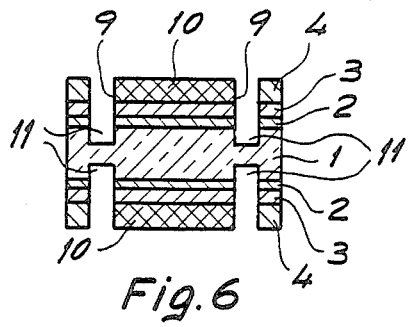

According to this process, a quartz wafer is first prepared according to conventional techniques. This wafer is preferably AT cut, to enable the establishing of a thickness shear mode in the resonators whose manufacture is proposed.

The two faces of this wafer or substrate 1 are then coated with metal covering which may comprise two superposed metal layers, respectively a layer of chromium 2 approximately 200 Å thick and a layer of gold 3 of approximately 2000 Å.

Next, the contours of the resonators to be manufactured and those of the networks of mechanical connections which allow the resonators to be handled during the various stages of the process are defined on the substrate. This stage consists (FIG. 2A) in applying a photoresist mask 4 to the two faces of the substrate. Thus, FIG. 2B shows the outline of a single resonator 5 fitted with connecting bridges 6 intended for linking the resonator to a connecting strip 7.

The next step is to carry out a selective chemical attack on the layers of gold and then chromium to expose the faces of the substrate outside the areas corresponding to the resonators, that is to say in the areas which are not masked by the photoresist 4.

The following stage of the process consists in applying to the two faces of the substrate a mask which only allows to be exposed to the light the areas forming a frame 8 (FIG. 3B) in each portion of the substrate corresponding to a resonator. The photoresist is exposed to the light and developed in such a way as to form a groove 9 (FIG. 3A) in the photoresist.

Another mask is then positioned on the unit thus treated, this mask enabling the central portions 10 of the resonators defined by the grooves 9 to be exposed to the light. However, at this stage these central portions are not develoepd, even after their exposure to the light, this being indicated in the figures by double hatching. At this point the substrate has the form shown in FIG. 4.

The next step is the chemical attack of the substrate itself, to separate the resonators from each other while preserving the connecting strip 7 and the connecting bridges 6 shown in FIGS. 2B and 3B. The substrate now has the form shown in FIG. 5.

The following stage consists in carrying out a selective chemical attack on the metallized portions located below the grooves 9 in the photoresist, followed by an attack on the quartz enabling the creation in the substrate itself of a groove 11 at the base of the grooves 9 in the photoresist. The substrate now has the form shown in FIG. 6.

The next step is to develop the already exposed photoresist in the central portion 10, followed by a selective attack on the underlying layers of metal in order to expose the quartz in the central portion.

Figure 7:
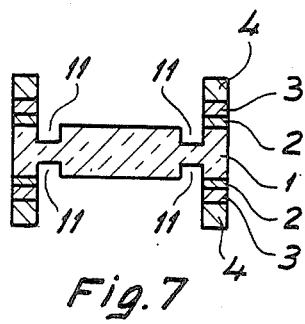

FIG. 7 shows the form obtained after the operations which have just be described. The substrate 1 comprises a central portion 1A which will become the resonator proper, a mechanical connecting portion 1B which will ensure the decoupling of the central portion's vibrations, and a reinforcing frame 1C surrounding the whole assembly. For the time being the portion 1C is still covered with metal layers and photoresist.

Starting from the form shown in FIG. 7 and according to an essential characteristic of the invention, the next step is once again to carry out a chemical attack on the substrate, in order to reduce and adjust the thickness of both the active portion 1A and the connecting portion 1B.

Figure 8:
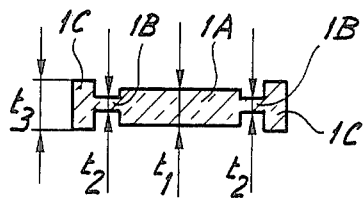

Then the rest of the photoresist and the remaining metal layers are removed, as a result of which operation the form shown in FIG. 8 is obtained.

Figure 9A:
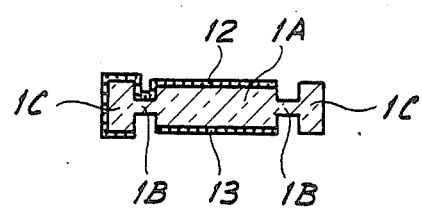
Figure 9B:
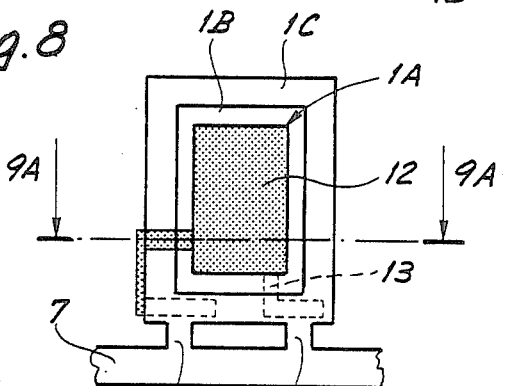

The final stage of the process consists in applying two electrodes 12 and 13 by metallization, in accordance with FIGS. 9A and 9B.

There are two important comments which should be made regarding the process just described.

1. The resonator which is finally obtained comprises the central portion 1A of the thickness $t_1$, which thickness determines the fundamental frequency. The thickness $t_1$ may be between 16 and 160 microns for a frequency ranging approximately from 100 MHz to 10 MHz, thes values being given purely by way of example. The central portion is surrounded by the connecting portion 1B of the thickness $t_2$, which thickness may range from 10 microns to a value approaching $t_1$, even a value only 5% lower producing excellent results with respect to decoupling the vibrations. Lastly the connecting portion 1B is surrounded by a reinforcing ring or frame 1C, whose thickness $t_3$ may be considerably greater than $t_1$ and $t_2$, a value located between 0.08 and 0.2 mm having proved favourable.

2. All the masking operations are carried out before the resonators are separated from each other, the exposure of the central portion 10 (FIG. 3B) taking place before the cutting-off or scribing operation (transition from FIG. 4 to FIG. 5). This particular feature allows a considerable reduction in manufacturing defects, as all the intensive handling necesary for masking and exposure is carried out while the quartz pellet substrate is still complete.

Figure 10:
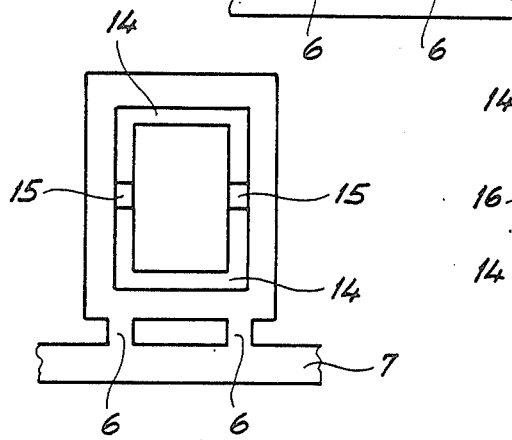
FIGS. 10 and 11 are plan views of two variants of a resonator obtained by this process.
Figure 11:
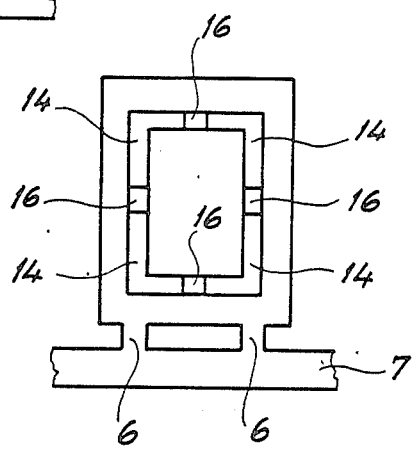

It has been supposed above that the active portion 1A of the resonator is attached to the reinforcing frame 1C all around the active portion's circumference. However, as is shown in FIGS. 10 and 11 it is also possible when separating the resonators (transition from FIG. 4 to FIG. 5) to make slits 14 going right through the substrate. The end result is that the resonator simply comprises connecting bridges joining the reinforcing frame to the active portion. In FIG. 10, these connecting bridges bear the reference numeral 15 and there are two of them, whereas in FIG. 11 there are four bridges bearing the reference numeral 16.

Of course, other variants can be imagined from that which has just been described. In particular, it is possible to vary the number of connecting bridges as in the embodiment shown in FIGS. 10 and 11. In particular, it is possible to provide only one of these bridges, in such a way as to obtain a suspended mounting of the central portion of the resonator.

I claim:

1. A process for manufacturing a quartz resonator, said resonator comprising an active central element surrounded by a reinforcing frame from which it is separated by at least one connecting member of a smaller thickness, said process consisting in subjecting a quartz substrate with parallel faces to selective operations of chemical etching and photolithography, and said operations comprising reducing the thickness of the substrate in the marginal area corresponding to said connecting member of said resonator whilst preserving those areas corresponding to said central element to said reinforcing frame, and further reducing the thickness of said marginal area at the same time as reducing the thickness of said central portion, said further reduction in thickness again not affecting the thickness of said reinforcing frame.

2. A process according to claim 1, wherein said resonator is an AT-cut resonator operating in the thickness shear vibration mode.

3. A process according to claim 1, wherein prior to carrying-out of said first reduction in thickness, said substrate is coated with a layer of photoresist, a groove is formed in said layer above said marginal area, the underlying area of said substrate being attacked until said first reducing thickness is obtained.

4. A process according to claim 3, wherein said second thickness reducing operation consists in eliminating said layer of photoresist above said central portion of said substrate and then in attacking the exposed portions of said substrate until said central portion reaches the thickness corresponding to the required frequency.

5. A process according to claim 1, wherein said first reduction in thickness is preceded by a scribing operation, effected by chemical attack of said substrate in order to define a plurality of resonators in said substrate.

6. A process according to claim 3, wherein said first reduction in thickness is preceded by a scribing operation, effected by chemical attack of said substrate in order to define a plurality of resonators in said substrate, and said scribing operation is carried out with the help of said layer of photoresist.

7. A process according to claim 6, characterised in that said scribing operation also consists in making at least one slit in the part of said marginal area of said substrate excluding said connecting member or members.

8. A process according to claim 7, wherein said photoresist layer is exposed to light in the area corresponding to said central portion prior to said scribing operation and the corresponding portion of said layer of photoresist is developed after said scribing operation but before said second thickness reducing operation.

9. A resonator obtained in accordance with the process according to claim 1, comprising an active central element surrounded by a reinforcing frame from which it is separated by at least one connecting member of a smaller thickness, wherein said resonator comprises an active central portion of thickness $t_1$ surrounded by a reinforcing frame of thickness $t_3$ to which said central portion is joined mechanically by at least one connecting member of thickness $t_2$, with $t_3 > t_1 > t_2$.

10. A resonator according to claim 9, comprising a single connecting member surrounding the whole of said central portion.

11. A resonator according to claim 10, wherein said connecting member is in the form of a bridge, the rest of a marginal area being occupied by a slit going right through the substrate from one face to the other.

12. A process for manufacturing a quartz resonator, comprising the steps of:
  (1) preparing a quartz substrate having parallel faces;
  (2) selectively etching at least one of said faces of said substrate for forming therein a closed loop groove surrounding a mesa-like part of said quartz substrate, said mesa-like part being substantially centrally located on said frame; and
  (3) selectively and simultaneously etching the surface of said mesa-like part and the bottom of said groove until a required thickness of said mesa-like part is obtained.

* * * * *